United States Patent
Sohn et al.

(10) Patent No.: US 7,171,919 B2
(45) Date of Patent: Feb. 6, 2007

(54) DIAMOND FILM DEPOSITING APPARATUS USING MICROWAVES AND PLASMA

(75) Inventors: Hee-Sik Sohn, Seoul (KR); Wayne H. Choe, Champaign, IL (US)

(73) Assignee: Small Business Corporation (KR)

( * ) Notice: Subject to any disclaimer, the term of this patent is extended or adjusted under 35 U.S.C. 154(b) by 150 days.

(21) Appl. No.: 10/471,216

(22) PCT Filed: Mar. 27, 2001

(86) PCT No.: PCT/KR01/00487

§ 371 (c)(1),
(2), (4) Date: Mar. 3, 2004

(87) PCT Pub. No.: WO02/077319

PCT Pub. Date: Oct. 3, 2002

(65) Prior Publication Data

US 2004/0134431 A1    Jul. 15, 2004

(51) Int. Cl.
| | |
|---|---|
| C23C 16/00 | (2006.01) |
| C23F 1/10 | (2006.01) |
| H01L 21/306 | (2006.01) |
| H01J 7/24 | (2006.01) |
| H05B 31/26 | (2006.01) |

(52) U.S. Cl. .................. 118/723 MW; 156/345.36; 156/345.41; 156/345.42; 156/345.46; 156/345.49; 315/111.21

(58) Field of Classification Search ........... 156/345.36, 156/345.41; 118/723 MW
See application file for complete search history.

(56) References Cited

U.S. PATENT DOCUMENTS

| | | | |
|---|---|---|---|
| 4,911,812 A | * | 3/1990 | Kudo et al. ............ 204/192.32 |
| 5,154,943 A | * | 10/1992 | Etzkorn et al. ............. 427/569 |
| 5,370,912 A | | 12/1994 | Bigelow et al. |
| 5,427,827 A | | 6/1995 | Shing et al. |
| 5,779,802 A | | 7/1998 | Borghs et al. |
| 5,954,882 A | * | 9/1999 | Wild et al. ........... 118/723 MW |
| 6,343,565 B1 | * | 2/2002 | Hongoh .............. 118/723 MW |
| 6,543,380 B1 | * | 4/2003 | Sung-Spitzl ........ 118/723 MW |

FOREIGN PATENT DOCUMENTS

WO    94/26952    11/1994

OTHER PUBLICATIONS

International Search Report—PCT/KR01/00487; ISA/Austrian Patent Office, Date Completed: Jun. 18, 2001.

* cited by examiner

*Primary Examiner*—Parviz Hassanzadeh
*Assistant Examiner*—Rakesh Dhingra
(74) *Attorney, Agent, or Firm*—Harness, Dickey & Pierce, P.L.C.

(57) ABSTRACT

Disclosed herewith is a diamond film depositing apparatus using microwaves and plasma. The apparatus comprises a rectangular wave guide (125), a mode transition coupler (120), an antenna rod (130), a quartz bell jar (140), a workpiece holder (116), a microwave cavity resonator (112), a source gas inflow ring (160), a mechanical support cylinder (164), a cooling jacket (165), gas inflow and outflow conduits (172 and 174) and a vacuum seal (190). The microwave cavity resonator (112) has a cylindrical shape the diameter of which is decreased in a downward direction. The microwave cavity resonator (112) may have a hemispherical shape, the flat surface of which is oriented upward.

7 Claims, 5 Drawing Sheets

141c

112

DIAMOND FILM DEPOSITING APPARATUS USING MICROWAVES AND PLASMA

TECHNICAL FIELD

The present invention relates generally to an apparatus for chemically depositing diamond thin films on workpieces utilizing electromagnetic waves, such as microwaves, and plasma, and more particularly to a diamond film depositing apparatus that is capable of uniformly depositing a diamond film over a relatively wider area as well as effectively utilizing energy.

BACKGROUND ART

With the development of mechanical engineering, there has been an increased demand for precision machining techniques for special materials, In particular, as an automobile industry is developed, a demand for precision machining techniques for nonferrous metallic materials, such as aluminum and copper, has been considerably increased.

When an insert or a tool made of WC or HSS is coated with diamond so as to meet the above-described demand, the life span of the insert or tool is improved along with its cutting speed and machining precision. Diamond is the hardest of all materials on Earth, has a relatively great thermal conductivity and does not react with nonferrous metals, so the life span of the insert or tool, its cutting speed and its machining precision are improved when an insert or a tool made of WC or HSS is coated with diamond.

A variety of techniques for growing a diamond thin film at a low pressure have been developed, and may be classified into the following five categories:

1. Thermal Activation or High-temperature Filament Activation Chemical Vapor Deposition (Chemical Vapor Deposition is abridged as "CVD", hereinafter) (S. Matsumoto, Y. Sato, M. Kamo, N. Sekada, Jpn, J. Appli. Phys.21, part 2, L183 (1982) et al.);

2. High-frequency Plasma Enhanced CVD (M. Kamo, Y. Sato, S. Matsumoto and N. Setaka, J. Cryst. Growth 62, 642 (1983); S. Matsumoto and Y. Matsui, J. Mater. Sci., 18, 1785 (1983); S. Matsumoto, J. Mater. Sci. Lett, 4, 600 (1985); S. Matsumoto, M. Hino and T. Kobayashi, Appl. Phys. Lett., 51, 737 (1987));

3. Direct Current Discharge Enhanced CVD (K. Suzuki, A. Sawabe, H. Yasuda and T. Inuzuka, Appl. Phys. Lett., 50, 728 (1987));

4. Combustion Frame Utilizing Method (Y. Hirose and M. Mitsuizumi, New Diamond, 4, 34 (1988)); and 5. Other Mixed Methods.

All these techniques are based upon an art of generating atomic hydrogen in the vicinity of the surface of a growing film. The most generally used synthetic method is Plasma Assisted CVD. In accordance with this method, a diamond film of high quality can be obtained. Many variations of this technique are utilized at a laboratory stage, but are not commercialized yet.

There have been developed a variety of apparatuses that can perform a diamond film depositing method. An apparatus proposed by Kamo et al. has a structure in which a silica tube having a diameter of about 40 mm is extended through a sleeve attached to a wave guide. In this apparatus, the silica tube is utilized as a deposition chamber, and the power (such as 2.45 GHz or 915 MHz) of microwaves is transmitted to the deposition chamber through a set of wave guides, a power monitor and a tuner. The plasma is controlled to be situated in the center portion of the chamber, and a substrate supported by an aluminum basket is situated at the location. A mixture of hydrogen and methane is allowed to pass through the chamber and microwaves are applied to induce the discharge of microwaves, so the deposition of a diamond film is carried out.

Thereafter, a diamond film depositing apparatus using a magnet-microwaves and plasma reactor developed by Kawarada et al. is known.

In an apparatus developed by Bachmann et al., a bell jar is employed as a microwaves and plasma reactor for growing a diamond film (P. K. Bachmann, W. Drawl, D. Knight, R. Weimer and R F. Messier, in Extended Abstracts Diamond and Diamond-like Materials Synthesis, edited by G. Johnson, A. Badzian, and M. Geis, Materials Research Society, Pittsburgh, Pa., 1988, p. 0.99).

U.S. Pat. No. 5,311,103 discloses a newly developed diamond depositing apparatus using microwaves and plasma. As illustrated in FIG. 1, a cavity 12 has an inner diameter of about 178 mm, and is defined by a cylinder 14 open at its top. In the lower portion of the cavity 12 are situated a metallic step 18A, a metallic base plate 20 and a metallic tube 22. The cavity 12 is closed at its bottom by a cavity bottom surface 18 supported on a metallic screen 24 mounted under a bottom plate 25 separated from a base plate 20 by a central ring plate 25A. An excitation probe 30 is held through an interior sleeve 104 by insulators 110 and 110A.

Source gas is supplied through a source gas inflow hole 36 and a source gas ring 38, and fills the lower portion of the cavity 12 by the restriction of a quartz disk chamber 40. The base plate 20 and the quartz disk chamber 40 are cooled by a water cooling channel 42 and a gas cooling channel 44 that communicate with a water cooling ring 42A and a gas cooling ring 44A, respectively.

A substrate 50, on which a diamond film is deposited, is placed on a susceptor 51 supported by a nonmetallic tube 52. The nonmetallic tube 52 is mounted on a movable stage 54 that is used to change the position of the substrate 50 with regard to plasma 56. The movable stage 54 is connected to a movable rod 58 that is extended through a vacuum chamber 60.

The apparatus 10 is installed over a vacuum chamber 62 that is comprised of a chamber tube 62, which is connected to a vacuum pump 68, and a chamber wall 64.

A water cooling line 70 passes through a slidable short 16 and around a metallic cylinder 14. Air cooling passages 72 and 74 are provided to cool the cavity 12.

As described above, U.S. Pat. No. 5,311,103 discloses a diamond film depositing apparatus in which the diffusion of plasma is performed within a space defined by the wall of a bell-shaped jar. Though the volume of plasma is relatively small, the volume is sufficient to cover a deposition area of a diameter of about 200 mm, thus being superior in energy efficiency. This apparatus has the following advantages; a relatively great energy efficiency due to the restriction of plasma diffusion to a relatively small space, the stable and reliable control of plasma diffusion, the relatively easy control of impurities due to the elimination of contact of plasma with a cavity resonator sidewall, and the relatively easy maintenance of a reactor due to the elimination of the necessity for keeping the interior of the cavity resonator vacuous. In order to place and remove a workpiece, the bell jar and the cavity resonator can be disassembled. In tests, it was found that the apparatus is capable of depositing a diamond film on any one of various workpieces under pressure of 0.5 to 100 Torr.

The patented apparatus has been successfully utilized to deposit a diamond film on a variety of workpieces. A conventional cavity resonator has a cylindrical shape that is radially and axially symmetrical.

In the patented apparatus, the power of microwaves is preferably concentrated on a portion from which plasma is diffused. Since the power of plasma and microwaves is concentrated on a workpiece, energy efficiency can be improved and unnecessary heating can be prevented.

However, as will be described in FIG. 4a, when a cylindrically shaped cavity is employed, the power of microwaves is concentrated not only on a portion from which plasma is diffused, but also on the upper and side portions of the cavity 12. Accordingly, the probe 30 and a cavity wall 14 are heated. As a result, in order to secure a working space greater than a certain size, it is necessary to increase the power of the microwaves. When the power is increased, the probe and the cavity wall are heated, thus requiring the cooling of them. Actually, in the apparatus disclosed in U.S. Pat. No. 5,311,103, a water cooling line 70 and air cooling pipes 72 and 74 are employed.

DISCLOSURE OF THE INVENTION

Accordingly, the present invention has been made keeping in mind the above problems occurring in the prior art, and an object of the present invention is to provide a diamond film depositing apparatus using microwaves and plasma, which is capable of improving the degree of concentration of microwaves on a workpiece by changing the shape of a cavity resonator constituting an element of the apparatus.

Another object of the present invention is to provide a diamond film depositing apparatus using microwaves and plasma, which is capable of controllably cooling a workpiece by introducing means for cooling a workpiece holder into the apparatus.

In order to accomplish the above object, the present invention provides a diamond film depositing apparatus using microwaves and plasma, comprising: a rectangular wave guide, a mode transition coupler, an antenna rod, a quartz bell jar, a workpiece holder, a microwave cavity resonator, a source gas inflow ring, a mechanical support cylinder, a cooling jacket, gas inflow and outflow conduits and a vacuum seal; wherein the microwave cavity resonator has a cylindrical shape, the diameter of which is decreased in a downward direction.

The microwave cavity resonator may have a hemispherical shape, the flat surface of which is oriented upward.

The workpiece holder may be comprised of a support plate on which a workpiece is placed, a hollow support pipe extended downwardly and attached to the bottom of the support plate to support the support plate, and water cooling means for cooling a workpiece placed on the support plate; the water cooling means being comprised of a cooling water cavity in the support pipe in the vicinity of the support plate, a cooling water inflow conduit longitudinally extended through the interior of the support pipe to guide cooling water to the cooling water cavity, and a cooling water outflow conduit connected to the lower portion of the support pipe to discharge cooling water that has cooled the workpiece.

BRIEF DESCRIPTION OF THE DRAWINGS

The above and other objects, features and other advantages of the present invention will be more clearly understood from the following detailed description taken in conjunction with the accompanying drawings, in which:

FIG. 4a is a view for the apparatus of a conventional art, and FIGS. 4b and 4c are views for the apparatuses of the present invention.

BEST MODE FOR CARRYING OUT THE INVENTION

Figure 1:
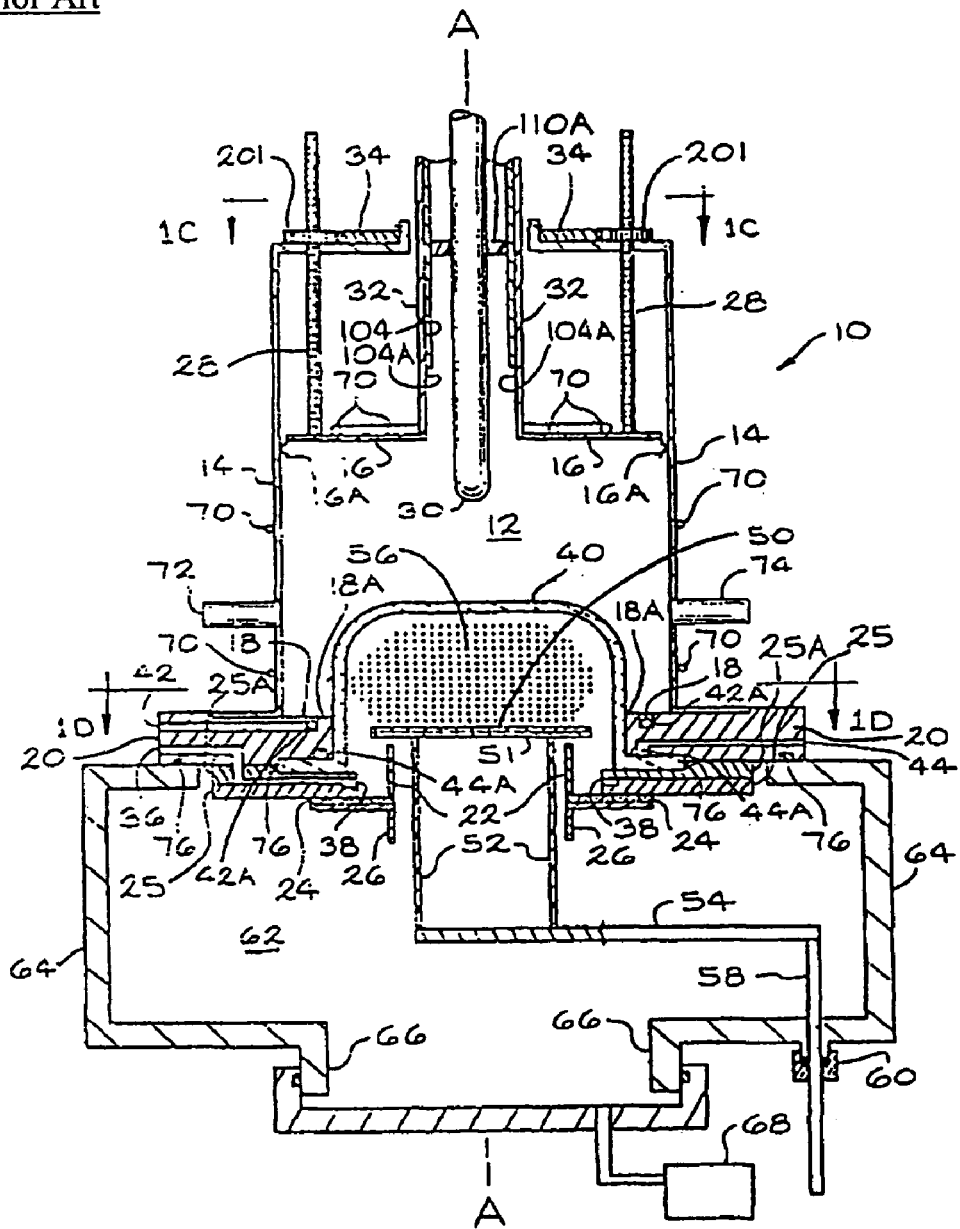
FIG. 1 is a cross section of a conventional diamond film depositing apparatus using plasma.

Reference now should be made to the drawings, in which the same reference numerals are used throughout the different drawings to designate the same or similar components.

Figure 2:
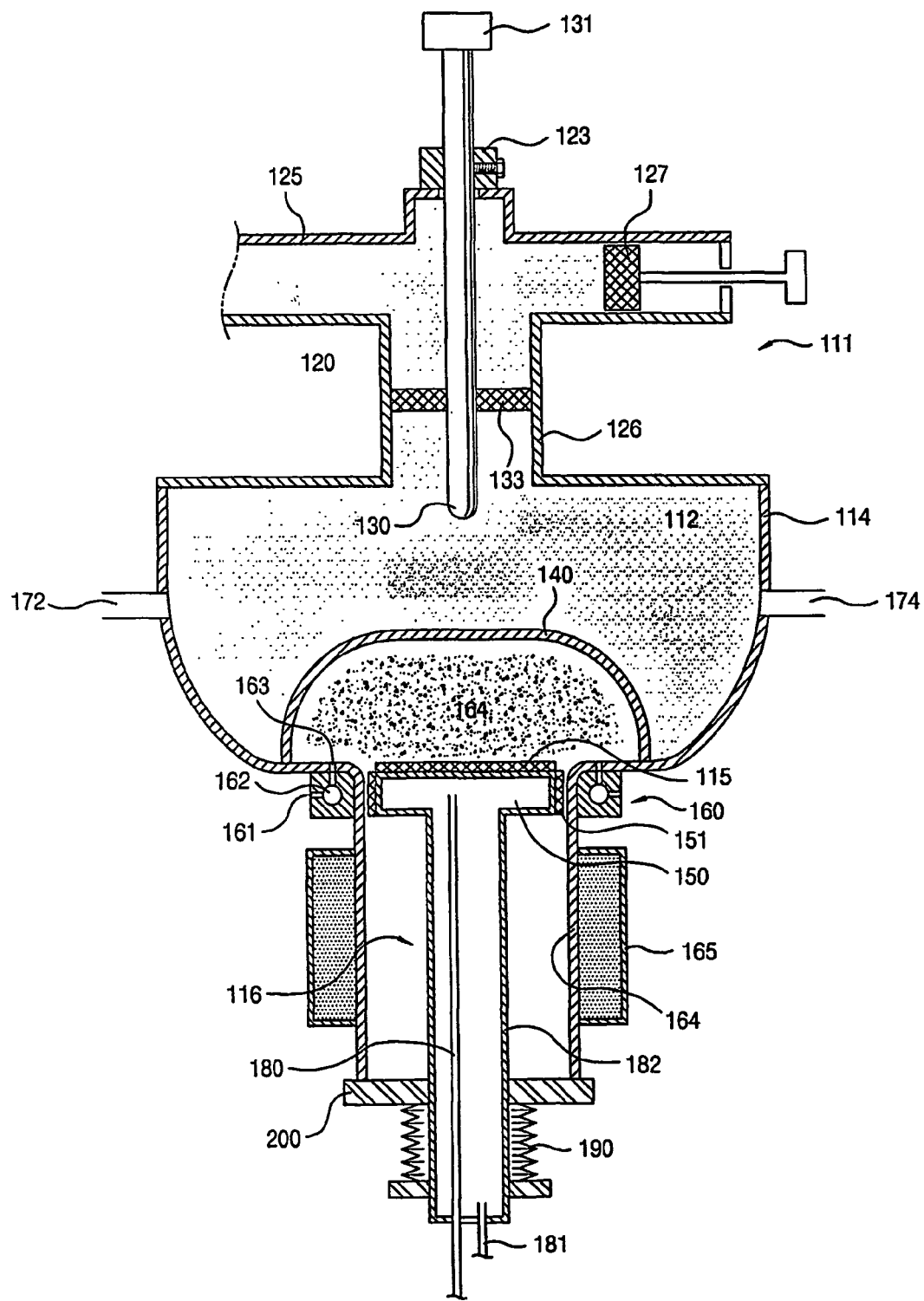
FIG. 2 is a sectional view showing a diamond film depositing apparatus using microwaves and plasma in accordance with a first embodiment of the present invention.

FIG. 2 is a cross section showing a diamond film depositing apparatus using microwaves and plasma in accordance with a first embodiment of the present invention. The diamond film depositing apparatus of the present invention is comprised of a rectangular wave guide 125, a mode transition coupler 120, an antenna rod 130, a quartz bell jar 140, a workpiece holder 116, a microwave cavity resonator 112, a source gas inflow ring 160, a mechanical support cylinder 164, a cooling jacket 165, gas inflow and outflow conduits 172 and 174 and a vacuum seal 190.

All the elements are described in more detail, hereinafter.

The mode transition coupler 120 serves to convert the square mode of electromagnetic waves into the circular transfer electromagnetic mode of microwaves. Electromagnetic impedance matching with the mode transition coupler 120 can be accomplished by adjusting the position of a short block 127 that is capable of moving through the region of the rectangular wave guide 125.

The antenna rod 130 is capable of vertically passing through the center holes of a clamp 123 and a spacer 133 in sleeve 126. The maximum depth to which the antenna rod 130 can be inserted into the interior of the cavity resonator 112 is restricted by a stopper 131. To restrict the maximum depth using the stopper 131 is to prevent the antenna rod 130 from being brought into contact with the quartz bell jar 140.

The quartz bell jar 140 functions to restrict the area in which plasma is discharged, and should have a minimum space sufficient to cover a working area.

Figure 4A:
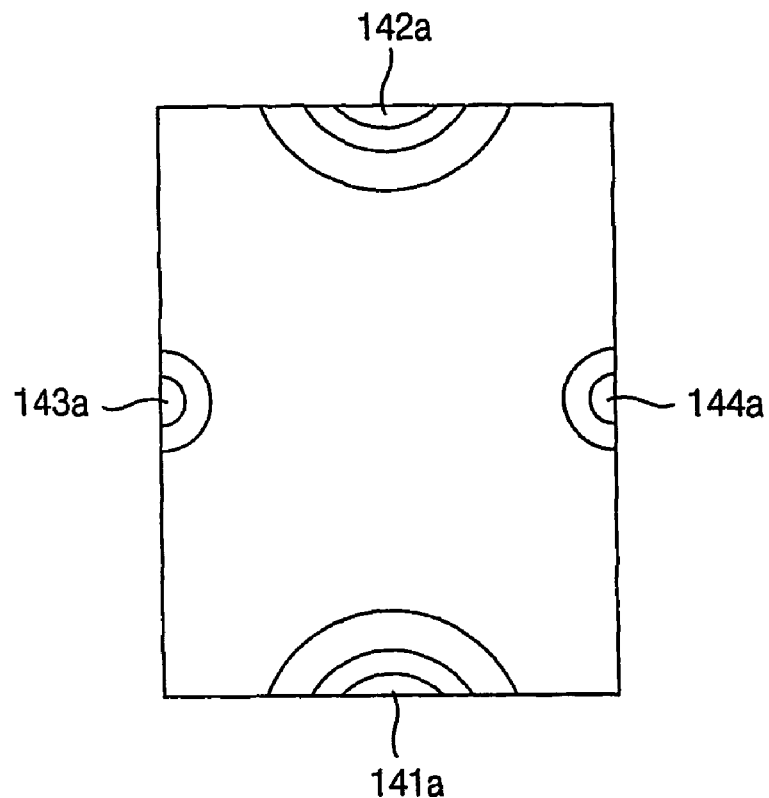
FIGS. 4a to 4c are views showing the distributions of the powers of electromagnetic waves.
Figure 4B:
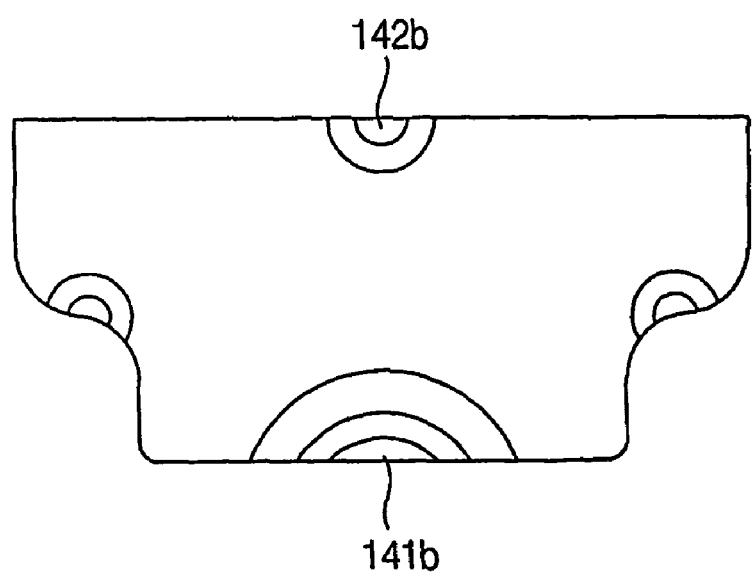
Figure 4C:
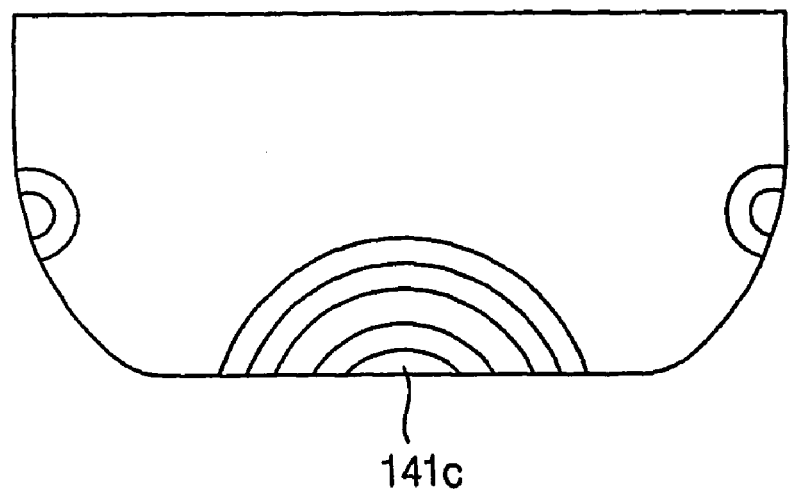

In accordance with a first embodiment of the present invention, the microwave cavity resonator 112, as shown in FIG. 2, has a hemispheric shape that is diminished in its diameter in a downward direction. The microwave cavity resonator 112 has this type of shape, so microwaves, as apparent from FIGS. 4a to 4c, are concentrated in the lower portion of the resonator, that is to say, the interior of the quartz bell jar to which plasma is discharged.

The workpiece holder 116 is comprised of a support plate 115 on which a workpiece is placed, a hollow support pipe 182 extended downwardly and attached to the bottom of the support plate 115 to support the support plate 115, and water cooling means for cooling a workpiece placed on the support plate 115. The water cooling means is comprised of a cooling water cavity 150 in the support pipe 182 in the vicinity of the support plate 15, a cooling water inflow conduit 180 longitudinally extended through the interior of the support pipe 182 to guide cooling water to the cooling water cavity 150, and a cooling water outflow conduit 181 connected to the lower portion of the support pipe 182 to discharge cooling water that has cooled the workpiece.

The cooling water cavity 150 is used to cool the support plate 115, and is electrically connected to a mechanical guide cylinder 164 through a plurality of finger stocks 151. Cooling water enters the cooling water cavity 150 through the cooling water inflow conduit 180, cools the support plate 115 and the workpiece while passing through the cooling water cavity 150, and is discharged through the cooling water outflow conduit 181 after having cooled the support plate 115 and the workpiece. The workpiece is cooled by forcibly circulating cooling water through the cooling inflow conduit 180, cooling water cavity 150 and cooling water outflow conduit 181 of the water cooling means. Additionally, the controllable cooling of a workpiece can be performed by controlling the temperature and amount of cooling water.

The source gas inflow ring 160 is comprised of one or more gas inflow conduits 161, a ring-shaped gas cavity 162, and a plurality of capillaries 163 uniformly spaced apart from one another to supply gas to a plasma discharge chamber formed in the quartz bell jar 140.

The mechanical support cylinder 164 is mounted on a base plate 200, and serves to support the entire apparatus by upholding the microwave cavity resonator 112 at its upper end.

The cooling jacket 165 is arranged to surround the mechanical support cylinder 164, and serves to cool the mechanical support cylinder 164.

In order to cool the microwave cavity resonator 112, cooling gas is supplied to the microwave cavity resonator 112 through a gas inflow conduit 172, and is discharged through the gas outflow conduit 174.

Bellows may be employed as the vacuum ring 190 for vacuum sealing.

Figure 3:
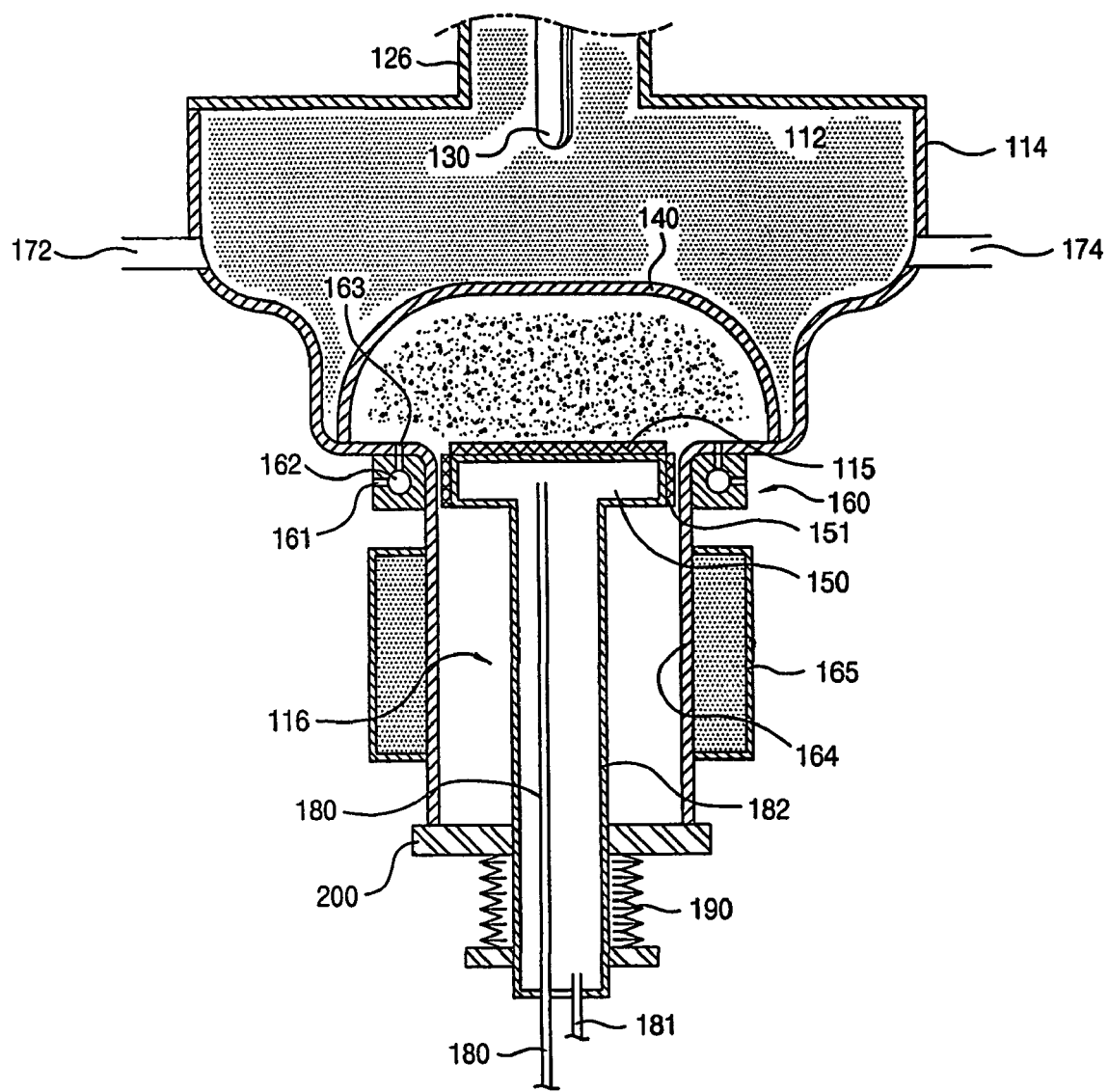
FIG. 3 is a sectional view showing a diamond film depositing apparatus using microwaves and plasma in accordance with a second embodiment of the present invention.

FIG. 3 is a sectional view showing a diamond film depositing apparatus using microwaves and plasma in accordance with a second embodiment of the present invention. In this second embodiment, a cavity resonator 112 has a stepped barrel shape in which the diameter of its upper half portion is greater than the diameter of its lower half portion. That is, the cavity resonator 112 of this embodiment abruptly grows smaller in diameter at its lower half portion.

The basic construction and other elements of the apparatus of the second embodiment is the same as those of the first embodiment, so the detailed description of the basic construction and other elements are omitted for the economical efficiency of description.

FIGS. 4a to 4c are views showing the distributions of the powers of electromagnetic waves; FIG. 4a is a view for the apparatus of a conventional art, and FIGS. 4b and 4c are views for the apparatuses of the present invention. In tests carried out for making the drawings, microwaves of 915 MHz are employed to excite a cavity resonator to $TM_{01}$ mode. In the drawings, the powers of electromagnetic waves are depicted by illustrating the square values of the intensities of electric fields $|E^2|$ in the forms of contour lines As indicated in FIG. 4a, for a conventional cylindrical cavity resonator, a power peak 141a appears in the lower portion of the cavity of the resonator in which a workpiece is situated, but another power peak 142a having a magnitude similar to that of the power peak 141a appears in the upper portion of the cavity of the resonator in which a probe or antenna rod is situated. Additionally, weak power peaks 143a and 144a appear in the vicinity of the sidewall of the resonator.

FIG. 4b is a view showing the distribution of the powers of electromagnetic waves for a stepped barrel-shaped cavity resonator (refer to FIG. 3) in accordance with the second embodiment of the present invention. In comparison with the conventional cylindrical cavity resonator (shown in FIG. 4a), a power peak 142b in the vicinity of a probe or antenna rod (in the upper portion of the cavity of the resonator) is weakened, while another power peak 141b in the vicinity of a workpiece holder, on which a workpiece is situated, is somewhat strengthened.

FIG. 4c is a view showing the distribution of the powers of electromagnetic waves for a hemispheric cavity resonator (refer to FIG. 2) in accordance with the first embodiment of the present invention. In comparison with the conventional cylindrical cavity resonator (shown in FIG. 4a), a power peak in the vicinity of a probe or antenna rod (in the upper portion of the cavity of the resonator) is considerably weakened and scarcely visible, while a power peak 141c in the vicinity of a workpiece holder (in the lower portion of the cavity of the resonator) is considerably strengthened.

The hemispherical cavity resonator (shown in FIG. 2) of the first embodiment having relatively small diameters in its lower portion is superior in the degree of concentration of the power of electromagnetic waves to the stepped barrel-shaped cavity resonator (shown in FIG. 3) of the second embodiment having a relatively great diameter. In particular, in the hemispheric cavity resonator of the first embodiment, a power peak does not appear in the upper portion of its inner cavity.

As a result, in accordance with the present invention, electromagnetic-plasma power coupling efficiency is improved, and the undesirable heating of the probe and cavity sidewall is prevented. Accordingly, the necessity for the cooling of the probe or antenna rod and resonator sidewall is decreased.

Although the diamond film depositing apparatus of the present invention is described through the embodiments, the diamond film apparatus is not restricted to the embodiments.

Figure 5:
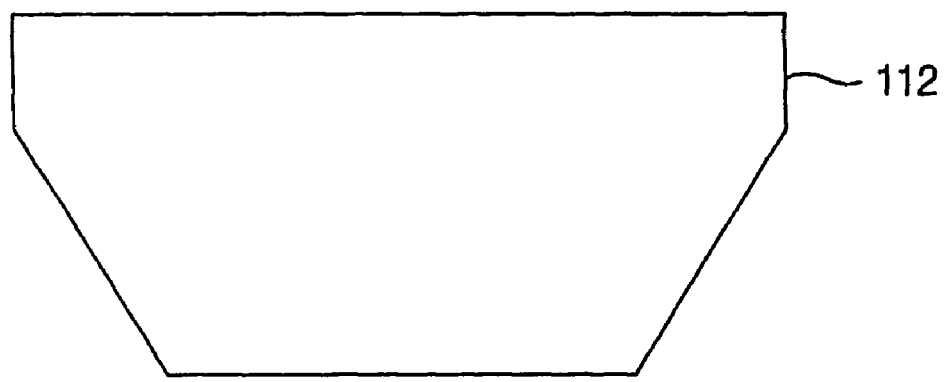
FIG. 5 is a sectional view showing a microwave cavity resonator in accordance with a third embodiment of the present invention.

In accordance with a third embodiment of the present invention, a microwave cavity resonator 112, as shown in FIG. 5, is a combination of an upper cylindrical portion and a lower truncated cone-shaped portion. The microwave cavity resonator 112 has this type of shape, so microwaves, as deduced from FIGS. 4a to 4c, are concentrated in the lower portion of the resonator, that is to say, the interior of the quartz bell jar to which plasma is discharged.

INDUSTRIAL APPLICABILITY

As described above, the present invention provides a diamond film depositing apparatus, which is capable of improving electromagnetic waves-plasma power coupling efficiency by fabricating its cavity resonator in the form of a hemisphere or stepped barrel reduced in diameter in a downward direction. In consequence, the power of microwaves can be concentrated on a portion in which plasma is generated, that is to say, a workpiece, and can enlarge a deposition area by actually increasing the volume of plasma.

In addition, when a cavity resonator of the present invention is employed, the undesirable heating of the unnecessary portions of the apparatus can be reduced or eliminated.

Accordingly, the necessity for cooling of the probe tip or resonator sidewall may be considerably reduced or eliminated.

Advantages of the improvement of the electromagnetic-plasma power coupling efficiency are the extension of an effective working area and a reduction in cost. Meanwhile, advantages of the reduction or elimination of the necessity for cooling of the antenna rod (probe) or cavity resonator sidewall are the improvement of power efficiency and the simplification of design.

In brief, the present invention provides a diamond film depositing apparatus, which is capable of uniformly depositing a diamond film over a wide area, reducing energy consumption by about 25% by an increase in power efficiency, and simplifying the design of the apparatus by the reduction or elimination of the necessity for cooling of the antenna rod (probe) or cavity resonator sidewall.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A diamond film depositing apparatus using microwaves and plasma, comprising:
    a microwave introducing device including a wave guide, a mode transition coupler connected to the wave guide and a microwave cavity resonator connected to the mode transition coupler and having a processing chamber comprising a quartz bell jar and a workpiece holder with a support plate on which a workpiece is placed,
    wherein said microwave cavity resonator is defined by a generally hollow body having an outer wall formed in the shape of a taper of circular cross-section having its widest end adjacent said mode transition coupler and its narrowmost end adjacent said support plate, the widest end being the portion of the body with the widest diameter and the narrowmost end being the portion of the body with the narrowmost diameter, wherein said body of said microwave cavity resonator provides a field strength distribution having a single main peak only in the vicinity of said workpiece holder within said microwave cavity resonator and a plurality of secondary peaks located at other regions within said microwave cavity resonator, the vicinity of said workpiece holder being a lower portion of said microwave cavity resonator where the workpiece is located.

2. The apparatus according to claim 1, wherein a part of said microwave cavity resonator has a cylindrical shape, the diameter of which is decreased in a downward direction.

3. The apparatus according to claim 1, wherein said body of said microwave cavity resonator has a hemispherical shape.

4. The apparatus according to claim 2 or 3 wherein:
    said workpiece holder is further comprised of a hollow support pipe and a cooling mechanism contained within the support pipe for cooling the workpiece placed on the support plate; and
    said cooling mechanism including a cooling cavity in the support pipe in the vicinity of the support plate, a cooling inflow conduit longitudinally extended through the interior of the support pipe to guide coolant to the cooling cavity, and a cooling outflow conduit connected to the lower portion of the support pipe to discharge coolant that has cooled the workpiece.

5. The apparatus according to claim 1 further comprising an antenna rod oriented along said mode transition coupler.

6. The apparatus according to claim 1 further comprising a source gas inflow ring arranged external to the processing chamber; a mechanical support cylinder externally at the bottom of the processing chamber; a cooling jacket arranged to surround the mechanical support cylinder; cooling gas inflow and out flow conduits connected to the processing chamber; and a vacuum seal arranged below the mechanical support for vacuum sealing the mechanical support cylinder.

7. A film depositing apparatus using microwaves and plasma, comprising:
    a microwave introducing device including a wave guide, a mode transition coupler connected to the wave guide and having a major axis that is perpendicular to the longitudinal axis of the wave guide, an antenna rod oriented along the mode transition coupler major axis, and a microwave cavity resonator connected to the mode transition coupler and having a processing chamber including a quartz bell jar and a workpiece holder having a support plate on which a workpiece is placed;
    a source gas inflow ring arranged external to the processing chamber;
    a mechanical support cylinder arranged externally at the bottom of the processing chamber;
    a cooling jacket arranged to surround the mechanical support cylinder;
    cooling gas inflow and outflow conduits connected to the processing chamber; and
    a vacuum seal arranged below the mechanical support cylinder for vacuum sealing the mechanical support cylinder;
    wherein the microwave cavity resonator is defined by a generally hollow body having an outer wall formed in the shape of a taper of circular cross-section having its widest end adjacent the mode transition coupler and its narrowmost end adjacent the support plate, the widest end being the portion of the body with the widest diameter and the narrowmost end being the portion of the body with the narrowmost diameter, wherein the body of the microwave cavity resonator provides a field strength distribution having a single main peak only in the vicinity of the workpiece holder within the microwave cavity resonator and a plurality of secondary peaks located at other regions within the microwave cavity resonator, the vicinity of the workpiece holder being a lower portion of the microwave cavity resonator where the workpiece is located.

* * * * *